United States Patent
Long et al.

(10) Patent No.: US 10,457,547 B2
(45) Date of Patent: Oct. 29, 2019

(54) MULTI-LAYER, STRESS-ISOLATION PLATFORM FOR A MEMS DIE

(71) Applicant: DunAn Microstaq, Inc., Austin, TX (US)

(72) Inventors: Wayne C. Long, Austin, TX (US); Joseph L. Nguyen, Austin, TX (US)

(73) Assignee: DunAn Microstaq, Inc., Austin, TX (US)

( * ) Notice: Subject to any disclaimer, the term of this patent is extended or adjusted under 35 U.S.C. 154(b) by 0 days.

(21) Appl. No.: 15/896,749

(22) Filed: Feb. 14, 2018

(65) Prior Publication Data

US 2018/0319654 A1    Nov. 8, 2018

Related U.S. Application Data

(60) Provisional application No. 62/502,290, filed on May 5, 2017.

(51) Int. Cl.
| | | |
|---|---|---|
| *B81C 1/00* | (2006.01) | |
| *B81C 3/00* | (2006.01) | |
| *B81B 7/00* | (2006.01) | |

(52) U.S. Cl.
CPC .......... *B81B 7/0029* (2013.01); *B81B 7/0048* (2013.01); *B81C 1/00325* (2013.01); *B81C 1/00357* (2013.01); *B81C 3/001* (2013.01); *B81B 2201/0264* (2013.01); *B81C 2203/035* (2013.01)

(58) Field of Classification Search
CPC ............ B81C 1/00357; B81C 1/00325; B81C 1/00309; B81C 1/00134; B81C 1/00952; B81C 3/001; B81C 3/005; B81C 2203/035; B81B 7/0029; B81B 7/0048; B81B 7/0058; B81B 7/0064; B81B 7/0067; B81B 2201/0264
See application file for complete search history.

(56) References Cited

U.S. PATENT DOCUMENTS

| | | | |
|---|---|---|---|
| 4,976,813 A | 12/1990 | Salensky et al. | |
| 7,533,793 B2 * | 5/2009 | Godijn | H05K 3/3478 156/250 |
| 7,623,353 B2 * | 11/2009 | Edmonson | H05K 1/183 333/133 |
| 9,140,613 B2 | 9/2015 | Arunasalam et al. | |
| 9,966,194 B2 * | 5/2018 | Gupta | B81B 7/0064 |
| 2005/0184129 A1 * | 8/2005 | Godijn | H05K 3/3478 228/56.3 |
| 2007/0096604 A1 * | 5/2007 | Edmonson | H05K 1/183 310/348 |
| 2017/0098509 A1 * | 4/2017 | Gupta | B81B 7/0064 |

FOREIGN PATENT DOCUMENTS

EP    0844809 A2    5/1998

* cited by examiner

*Primary Examiner* — Nikolay K Yushin
(74) *Attorney, Agent, or Firm* — MacMillan, Sobanski & Todd, LLC

(57) ABSTRACT

A multi-layer, stress-isolation platform configured for attaching a MEMS die to a base includes a first platform, a first layer of attachment material between the base and the first platform and attaching the first platform to the base, a MEMS die, and a second layer of attachment material between the first platform and the MEMS die and attaching the MEMS die to the first platform.

20 Claims, 5 Drawing Sheets

MULTI-LAYER, STRESS-ISOLATION PLATFORM FOR A MEMS DIE

BACKGROUND OF THE INVENTION

This invention relates in general to a Micro Electro Mechanical Systems (MEMS) die. In particular, this invention relates to an improved attachment platform and method for attaching the MEMS die to a mounting surface that reduces torque sensitivity and reduces the transmission of stress between the MEMS die and the mounting surface to which the MEMS die is attached.

According to a known method, solder paste or a solder preform is placed onto a mounting surface, such as a pedestal of a valve, fluid control device, fluid system parameter sensing device, and the like. A MEMS die is then placed onto the solder paste or the solder preform and the solder paste or the solder preform is heated in a re-flow operation.

During attachment of the MEMS die, such as a MEMS die configured as a MEMS fluid pressure sensor, to a mounting surface, mechanical stress may be generated and transmitted to the MEMS fluid pressure sensor. Such mechanical stress may adversely affect the MEMS fluid pressure sensor's performance.

For example, the MEMS fluid pressure sensor may use a Wheatstone bridge strain gauge. Such a MEMS fluid pressure sensor may have a chamber with a flexible wall that deforms in response to fluid pressure in the chamber, thus producing strain. In this context, strain is the response of a system to an applied stress. When a material is loaded with a force, it produces stress, which may then cause the material to deform. As used herein, engineering strain is defined as the amount of deformation in the direction of the applied force divided by the initial length of the material. The strain gauge senses this deformation, and generates an output signal representative of the fluid pressure in the pressure chamber.

In one conventional device, the MEMS fluid pressure sensor is soldered to the mounting surface of the device body or base, and the base then threaded into a housing, such as a Schrader valve housing. As the base is tightened into the housing, applied torque may generate non-transitory stress in the base that is transmitted through the solder to the MEMS fluid pressure sensor, such that the strain gauge detects a strain and will erroneously report a fluid pressure when no fluid pressure is present in a pressure chamber of the MEMS fluid pressure sensor.

Thus, it would be desirable to provide an improved attachment platform and improved method for attaching a MEMS die to a mounting surface that reduces torque sensitivity and reduces the transmission of stress between the MEMS die and the mounting surface to which the MEMS die is attached.

SUMMARY OF THE INVENTION

This invention relates to an improved structure and method for attaching a MEMS die to a mounting surface that reduces torque sensitivity and the transmission of stress between the MEMS die and the mounting surface to which the MEMS die is attached.

In a first embodiment of the invention, a multi-layer, stress-isolation platform is configured for attaching a MEMS die to a base, and includes a first platform, a first layer of attachment material between the base and the first platform and attaching the first platform to the base, a MEMS die, and a second layer of attachment material between the first platform and the MEMS die and attaching the MEMS die to the first platform.

In a second embodiment of the invention, a method of attaching a MEMS die to a base includes positioning a first attachment material preform on a base, positioning a first platform on the first solder preform, positioning a second attachment material preform on the first platform, positioning a MEMS die on the second solder preform, and heating the first and second solder preform in a re-flow process to attach the MEMS die to the first platform and to attach the first platform to the base.

Various aspects of this invention will become apparent to those skilled in the art from the following detailed description of the preferred embodiments, when read in light of the accompanying drawings.

DETAILED DESCRIPTION OF THE PREFERRED EMBODIMENTS

Figure 1:
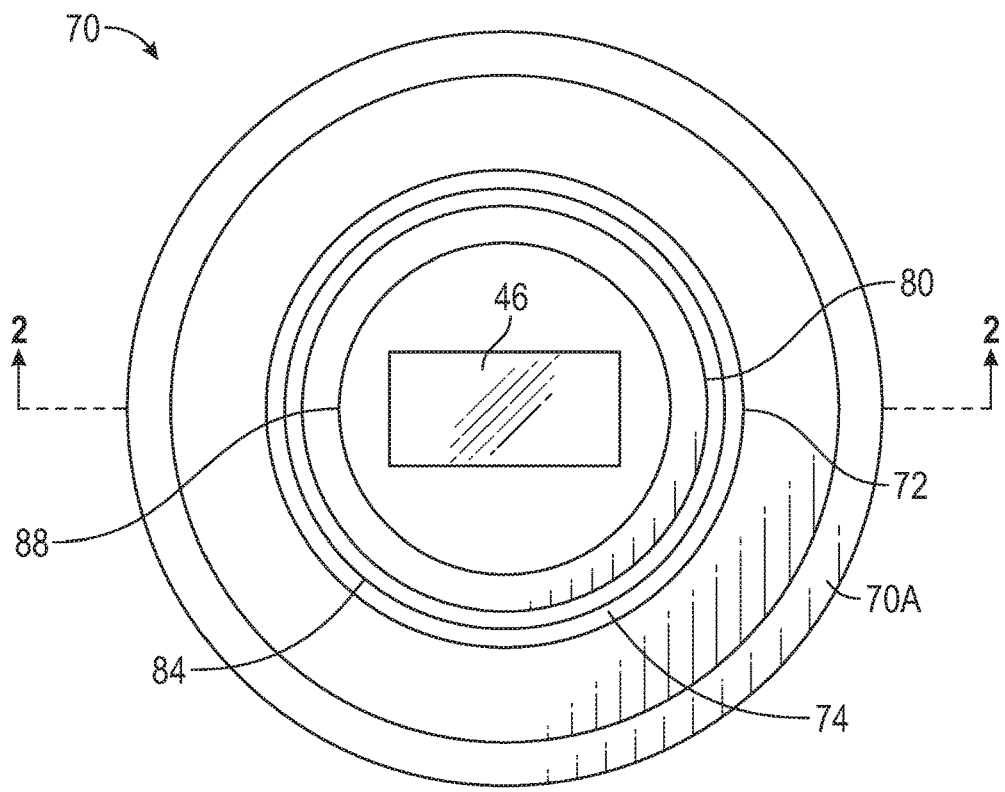
FIG. 1 is a top plan view of an embodiment of a fluid inlet member according to the invention and to which the method of the invention may be applied.
Figure 2:
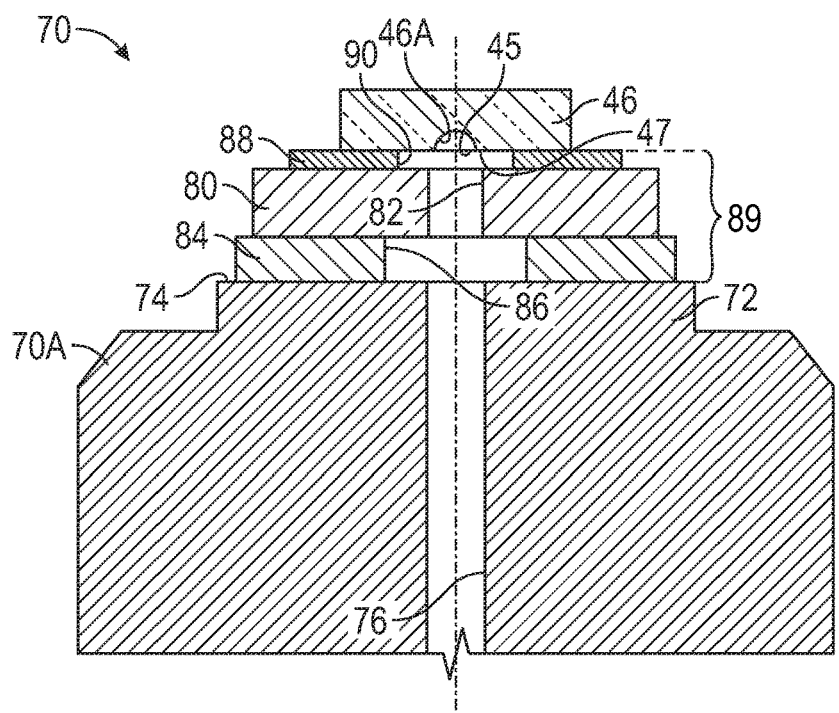
FIG. 2 is a cross-sectional view taken along the line 2-2 of FIG. 1.

Referring now to the drawings, there is shown at 70 in FIGS. 1 and 2 an embodiment of a body or base configured as a fluid inlet member to which the method according to the invention may be applied.

Figure 3:
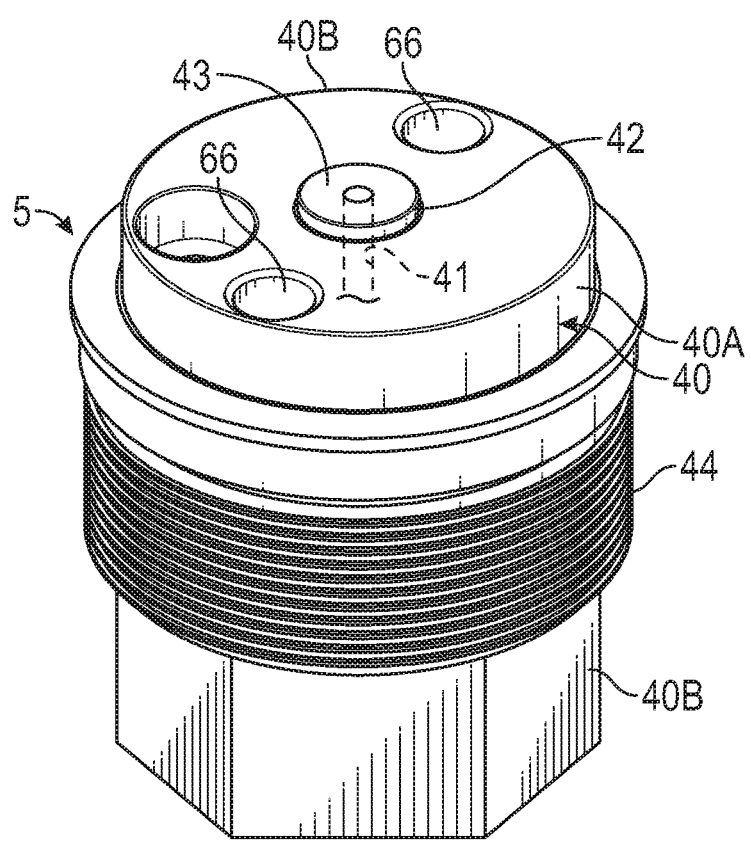
FIG. 3 is a perspective view of a portion of a superheat controller to which the method according to the invention may be applied.

One embodiment of a portion 5 of a known superheat controller (SHC) (not shown, but substantially similar to a SHC 10 shown in FIGS. 4 and 5) is shown in FIG. 3 and is configured such that the method of the invention may be applied thereto. The portion 5 of the SHC shown in FIG. 3 includes a body or base defining a fluid inlet member 40. The fluid inlet member 40 is similar to a fluid inlet member 18 described below and includes a substantially cylindrical pedestal 42 formed on a first end 40A of the fluid inlet member 40. The pedestal 42 includes a mounting surface 43. The fluid inlet member 40 includes a central portion 44 between the first end 40A and a second end 40B that may include external threads. The illustrated fluid inlet member 40 may be formed from brass or copper. Alternatively, the fluid inlet member 40 may be formed form other metals, metal alloys, and non-metal materials. Additionally, the solder receiving surface of the fluid inlet member 40 may be plated with a desired metal, such as gold or nickel. Such a plated surface is known to enhance solder joint longevity for many conventional solder alloy compositions.

U.S. Pat. No. 9,140,613 discloses a superheat controller (SHC). The SHC disclosed therein is a single, self-contained, stand-alone device which contains all the sensors, electronics, and intelligence to automatically detect a fluid type, such as refrigerant, and report the superheat of multiple common fluid types used in residential, industrial, and scientific applications. U.S. Pat. No. 9,140,613 is incorporated herein in its entirety.

Figure 4:
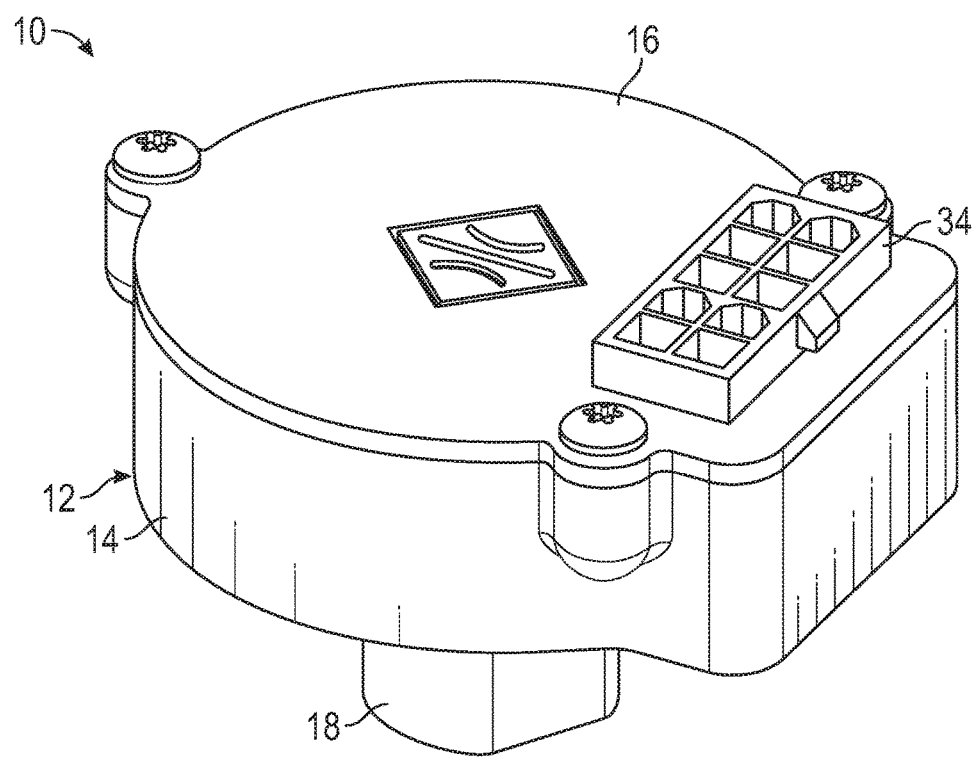
FIG. 4 is a perspective view of a known universal superheat controller.
Figure 5:
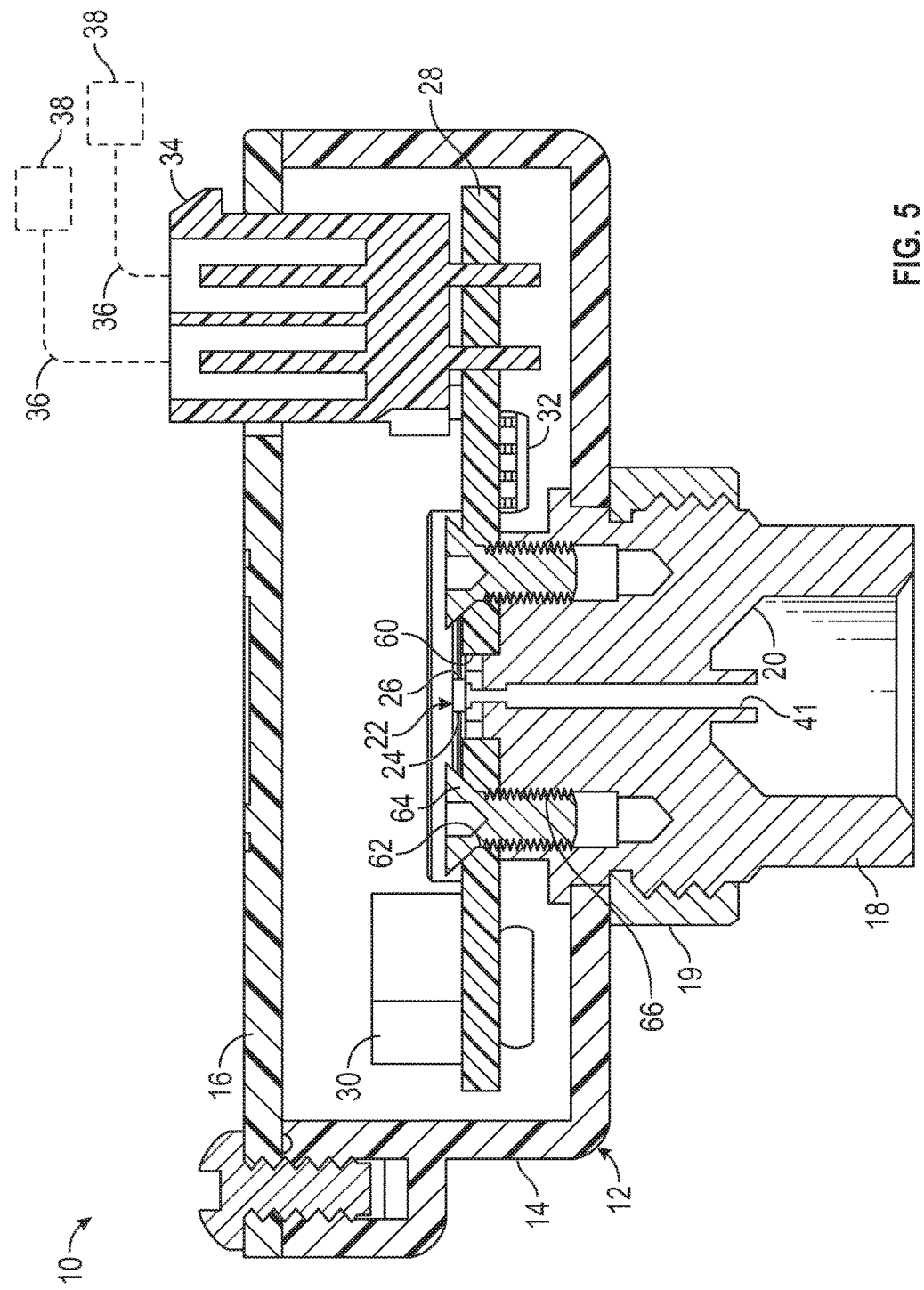
FIG. 5 is a cross-sectional view of the known universal superheat controller illustrated in FIG. 3.

FIGS. 4 and 5 herein illustrate a SHC 10, which is similar to the superheat controller disclosed in U.S. Pat. No. 9,140,613. As shown in FIGS. 4 and 5, the illustrated embodiment of the SHC 10 includes a housing 12 having a body 14, a cover 16, and the base that defines the fluid inlet member 18. The fluid inlet member 18 may be secured to the housing 12 by a mounting ring 19. The mounting ring 19 attaches the fluid inlet member 18 to the housing 12 portion by a threaded connection. Alternatively, the mounting ring 19 may be attached to the fluid inlet member 18 by any desired method, such as by welding or press fitting. In the embodiment illustrated in FIGS. 4 and 5, the fluid inlet member 18 is a brass fitting having a centrally formed opening that defines a sealing surface 20.

A first embodiment of a pressure port 41 is formed in the fluid inlet member 40 from the mounting surface 43 of the pedestal 42 to a first end 40A of the fluid inlet member 40 (see FIG. 3). The pressure port 41 is configured as a bore and may convey pressurized fluid to be measured through the fluid inlet member 40, and into a pressure sensing chamber 46A through a fluid port 45 (see FIG. 2) of a MEMS die configured as a MEMS pressure sensor die 46, described below. A lower surface of the MEMS pressure sensor die 46 defines a bonding surface 47 (the downwardly facing surface when viewing FIG. 2).

The SHC 10 includes an integrated pressure and temperature sensor 22 having pressure sensor portion 24 and a temperature sensor portion 26 mounted to a printed circuit board (PCB) 28. A superheat processor 30, a data-reporting or communication module 32, and an Input/Output (IO) module 34 are also mounted to the PCB 28. The IO module 34 is a physical hardware interface that accepts input power and reports data through available hard-wired interfaces, such as wires or cables 36, to the superheat processor 30. Target devices 38 that may be connected to the SHC 10 via the IO module 34 may include additional temperature sensors, laptop and notebook computers, cell phones, memory cards, and any device used in or with conventional end of the line test equipment. Alternatively, the target devices 38 may be connected to the communication module 32 by a wireless connection.

The superheat processor 30 is mounted to the PCB 28 and is a high-resolution, high accuracy device that processes the input signals from the pressure and temperature sensor portions 24 and 26, respectively, of the integrated pressure and temperature sensor 22, detects the fluid type, calculates the superheat of the fluid, and provides an output that identifies the level of the calculated superheat. The superheat processor 30 may also be configured to provide other data, such as fluid temperature, fluid pressure, fluid type, relevant historical dates maintained in an onboard memory (such as alarm and on-off history), and other desired information. Advantageously, the superheat processor 30 maintains a high level of accuracy over a typical operating range of pressure and temperature after a one-time calibration. Non-limiting examples of suitable superheat processors include microcontrollers, Field Programmable Gate Arrays (FPGAs), and Application Specific Integrated Circuits (ASICs) with embedded and/or off-board memory and peripherals.

The PCB 28 includes a die aperture 60, and two fastener apertures 62. The PCB 28 may be attached to the fluid inlet member 18 with fasteners, such as threaded fasteners 64 (see FIG. 4) that extend through the fastener apertures 62 and into threaded bores 66 formed in the fluid inlet member 18.

Referring again to FIGS. 1 and 2, a portion of the fluid inlet member 70 is shown and is similar to the fluid inlet member 40 shown in FIG. 3. The fluid inlet member 70 includes a substantially cylindrical pedestal 72 formed on a first end 70A thereof. The pedestal 72 includes a mounting surface 74. Alternatively, the cylindrical pedestal 72 may have a substantially rectangular peripheral edge.

The fluid inlet member 70 may also include a central portion (not shown, but substantially similar to the central portion 44 shown in FIG. 3 that may include external threads (not shown), but substantially similar to the threads shown in FIG. 3. Like the fluid inlet member 40, the illustrated fluid inlet member 70 may be formed from brass or copper. Alternatively, the fluid inlet member 70 may be formed from other metals, metal alloys, and non-metal materials. Additionally, the solder receiving surface of the fluid inlet member 70 may be plated with a desired metal, such as gold or nickel. Such a plated surface is known to enhance solder joint longevity for many conventional solder alloy compositions.

A pressure port 76 is formed in the fluid inlet member 70 from the mounting surface 74 of the pedestal 72 to a second end (not shown) of the fluid inlet member 70. Like the pressure port 41, the pressure port 76 is configured as a bore having a port opening 78, and may convey pressurized fluid to be measured through the fluid inlet member 70, and into the pressure sensing chamber 46A of the MEMS pressure sensor die 46.

At least a portion of the pressure port 76 formed through the pedestal 72 may have a uniform diameter. In the remaining portion of the fluid inlet member 70, the bore defining the pressure port 76 may have a diameter equal to or larger than the diameter of the portion of the pressure port 76 formed through the pedestal 72.

Figure 6:
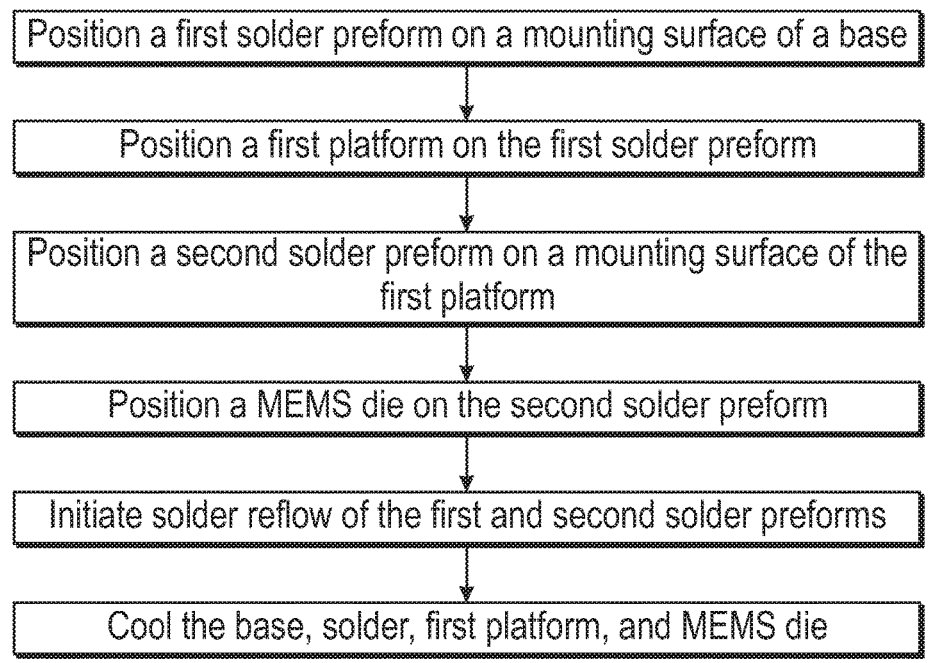
FIG. 6 is a flow chart showing the improved method according to this invention.

Referring also to FIG. 6, in a first step of the method of the invention, a first attachment material or solder preform 84 may be positioned on the mounting surface 74 of the pedestal 72, and a first platform 80 may be positioned on the first solder preform 84. With the addition of the first platform 80, the pedestal 72 defines a second platform. The illustrated first platform 80 is annular, thus having a substantially circular peripheral edge, and has a centrally formed bore 82 formed therethrough. The illustrated first solder preform 84 is also annular, thus having a substantially circular peripheral edge, and has a centrally formed opening 86 formed therethrough.

Alternatively, the first platform 80 may have any desired shape, such as substantially rectangular. Similarly, the first solder preform 84 may have any desired shape, such as substantially rectangular, and the first platform 80 may be aligned thereon by any means, such as by an assembler by visual positioning and hand placement, i.e., without the aid of alignment tools. It will be understood that the first platform 80 and the first solder preform 84 may have the same peripheral edge shape or may have different peripheral edge shapes.

Like the fluid inlet member 70, the first platform 80 may be formed from brass or copper. Alternatively, the first platform 80 may be formed from other metals, metal alloys, and non-metal materials.

In a second step of the method of the invention, a second attachment material or solder preform 88 may be positioned on the first platform 80, and the MEMS pressure sensor die 46 may be positioned on the second solder preform 88. The illustrated second solder preform 88 may be annular, thus having a substantially circular peripheral edge, and has a centrally formed opening 90 formed therethrough. Alternatively, the second solder preform 88 may have any desired shape, such as substantially rectangular. The first solder preform 84, the second solder preform 88, and the first platform 80 cooperate to define an improved attachment platform, configured as a multi-layer, stress-isolation platform 89.

The MEMS pressure sensor die 46 may be aligned on the multi-layer, stress-isolation platform 89 by an assembler by visual positioning and hand placement, i.e., without the aid of alignment tools.

In a third step of the method of the invention, the first and second solder preforms 84 and 88 may be heated to initiate solder reflow, such as in a conventional re-flow operation. The first and second solder preforms 84 and 88 may then be allowed to cool and harden, thereby attaching the first platform 80 to the pedestal 72 and attaching the MEMS pressure sensor die 46 to the first platform 80.

It will be understood that each of the first solder preform 84 and the second solder preform 88 may have any desired thickness. For example, the thickness of each of the first solder preform 84 and the second solder preform 88 may be selected to reduce torque sensitivity and to minimize the transmission of stress from the pedestal 72 to the MEMS pressure sensor die 46. Preferably, the second solder preform 88 may be relatively thin, such as within the range of about 0.0025 inches to about 0.008 inches (63 μm to about 203 μm), and the first solder preform 84 may have a thickness greater than a thickness of the second solder preform 88 to minimize the transmission of stress from the pedestal 72 to the first platform 80, and ultimately to the MEMS pressure sensor die 46. The first solder preform 84 may therefore have a thickness within the range of about 0.004 inches to about 0.016 inches (102 μm to about 406 μm). It will be further understood that if desired, the first solder preform 84 may also be relatively thin, such as about the thickness of the second solder preform 88, i.e., such as within the range of about 0.0025 inches to about 0.008 inches (63 μm to about 203 μm).

In addition to the first solder preform 84 and the second solder preform 88 described above, other suitable attachment materials may be used. For example, attachment material including, but not limited to, solder paste, thick solvent-resistant adhesives, and epoxy may be used. If an epoxy is used in lieu of the second solder preform 88, then the epoxy may have a thickness of up to about 0.04 inches (1.0 mm) Similarly, if an epoxy is used in lieu of the first solder preform 84, then the epoxy may have a thickness of up to about 0.06 inches (1.5 mm).

In FIGS. 1 and 2, the fluid inlet member 70 is shown with the pedestal 72 formed on the first end 70A thereof. Alternatively, the fluid inlet member 70 may be formed without the pedestal 72 and the first platform 80 may therefore be attached to a surface (the upwardly facing surface when viewing FIG. 2) of the fluid inlet member 70.

Advantageously, the structure of the fluid inlet member 70 and the method of the invention disclosed herein successfully isolate the sensitive MEMS pressure sensor die 46 from the internal, mechanical, and thermally induced stresses of the second platform, i.e., the pedestal 72. The intermediary first platform 80 is preferably a relatively small, inexpensive layer. Advantageously, the combination of the first platform 80, the first solder preform 84, and the second solder preform 88 forms a mechanical stress insulation barrier.

In a known manner, the MEMS pressure sensor die 46, the second solder preform 88, the first platform 80, and the first solder preform 84 may be aligned relative to the pedestal 72 and to each other by an assembler by visual positioning and hand placement, and by the selection of a shape of the first and second solder preform 84 and 88. Additionally, this alignment may be assisted by the selection and placement of a solder mask by any desired conventional method.

As shown in FIG. 2, a diameter of the pressure port 76 is larger than a diameter of the bore 82, and the diameter of the bore 82 is larger than the fluid port 45.

An additional advantage of the method of the invention is that any misalignment of the bore 82 of the first platform 80 relative to the pressure port 76 is mitigated because the size of the pressure port 76 is sufficiently larger than the size of the bore 82. Thus, the first platform 80 may be significantly off center relative to the pressure port 76, but the bore 82 will still have unobstructed fluid communication with the pressure port 76.

Similarly, the size of the bore 82 is sufficiently larger than the fluid port 45 in the MEMS pressure sensor die 46. Thus, the fluid port in the MEMS pressure sensor die 46 may be significantly off center relative to the bore 82, but the port in the MEMS pressure sensor die 46 will still have unobstructed fluid communication with the bore 82.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A multi-layer, stress-isolation platform configured for attaching a MEMS pressure sensor die to a base comprising:
   a single bore defining a pressure port formed in the base;
   a first platform, formed from a solid material and having a single, centrally formed bore therethrough;
   a first layer of attachment material between the base and the first platform and attaching the first platform to the base, the first layer of attachment material having a single, centrally formed opening therethrough;
   a MEMS pressure sensor die having a fluid port formed therein; and
   a second layer of attachment material between the first platform and the MEMS die and attaching the MEMS pressure sensor die to the first platform, the second layer of attachment material having a single, centrally formed opening therethrough;
   wherein the first platform, the first layer of attachment material, and the second layer of attachment material cooperate to define an attachment platform, configured as a multi-layer, stress-isolation platform; and
   wherein the centrally formed opening of the first layer of attachment material, the centrally formed bore of the first platform, and the centrally formed opening of the second layer of attachment material are aligned to define a pressurized fluid flow path between the pressure port formed in the base and the fluid port formed in the MEMS pressure sensor die.

2. The multi-layer, stress-isolation platform according to claim 1, wherein at least one of the first layer of attachment material and the second layer of attachment material is formed from one of solder paste, solvent-resistant adhesive, and epoxy.

3. The multi-layer, stress-isolation platform according to claim 2, wherein the first layer of attachment material is epoxy having a thickness within the range of up to about 0.06 inches.

4. The multi-layer, stress-isolation platform according to claim 2, wherein the second layer of attachment material is epoxy having a thickness within the range of up to about 0.04 inches.

5. The multi-layer, stress-isolation platform according to claim 1, wherein the first layer of attachment material and the second layer of attachment material is solder.

6. The multi-layer, stress-isolation platform according to claim 5, wherein the first layer of attachment material is solder having a thickness within the range of about 0.0004 inches to about 0.016 inches.

7. The multi-layer, stress-isolation platform according to claim 5, wherein the first layer of attachment material is solder having a thickness a thickness within the range of about 0.0025 inches to about 0.008 inches.

8. The multi-layer, stress-isolation platform according to claim 5, wherein each of the first layer of attachment material and the second layer of attachment material is annular.

9. The multi-layer, stress-isolation platform according to claim 5, wherein the first platform is annular.

10. The multi-layer, stress-isolation platform according to claim 5, wherein the second layer of attachment material is solder having a thickness within the range of about 0.0025 inches to about 0.008 inches.

11. A method of attaching a MEMS pressure sensor die to a base, the method comprising:
   positioning a first attachment material preform on a base, wherein the first attachment material preform has a single, centrally formed opening therethrough and the base has a single bore defining a pressure port formed therein;
   positioning a first platform on the first attachment material preform, the first platform formed from a solid material and having a single, centrally formed bore therethrough;
   positioning a second attachment material preform on the first platform, wherein the second attachment material preform has a single, centrally formed opening therethrough;
   positioning a MEMS pressure sensor die on the second attachment material preform, the MEMS pressure sensor die having a fluid port formed therein; and
   heating the first and second attachment material preform in a re-flow process to attach the MEMS pressure sensor die to the first platform and to attach the first platform to the base;
   wherein the first platform, the first attachment material preform, and the second attachment material preform cooperate to define an attachment platform, configured as a multi-layer, stress-isolation platform; and
   wherein the centrally formed opening of the first attachment material preform, the centrally formed bore of the first platform, and the centrally formed opening of the second attachment material preform are aligned to define a pressurized fluid flow path between the pressure port formed in the base and the fluid port formed in the MEMS pressure sensor die.

12. The method according to claim 11, wherein at least one of the first attachment material preform and the second attachment material preform is formed from one of solder paste, solvent-resistant adhesive, and epoxy.

13. The method according to claim 11, wherein the first attachment material preform and the second attachment material preform is solder preform.

14. The method according to claim 13, wherein the first solder preform is annular.

15. The method according to claim 13, wherein the first solder preform has a thickness within the range of about 0.0004 inches to about 0.016 inches.

16. The method according to claim 13, wherein the first solder preform has a thickness within the range of about 0.0025 inches to about 0.008 inches.

17. The method according to claim 13, wherein the first platform is annular.

18. The method according to claim 13, wherein the second solder preform is annular.

19. The method according to claim 13, wherein the second solder preform has a thickness within the range of about 0.0025 inches to about 0.008 inches.

20. The method according to claim 13, wherein the first platform is formed from one of brass and copper.

* * * * *

UNITED STATES PATENT AND TRADEMARK OFFICE
CERTIFICATE OF CORRECTION

PATENT NO. : 10,457,547 B2
APPLICATION NO. : 15/896749
DATED : October 29, 2019
INVENTOR(S) : Wayne C. Long et al.

Page 1 of 1

It is certified that error appears in the above-identified patent and that said Letters Patent is hereby corrected as shown below:

In the Claims

Column 7, Claim 7, Line 14, please correct from:
"solder having a thickness a thickness within the range of"
To:
--solder having a thickness within the range of--

Signed and Sealed this
Twenty-first Day of January, 2020

Andrei Iancu
*Director of the United States Patent and Trademark Office*